US008664994B1

(12) United States Patent
Amrutur et al.

(10) Patent No.: US 8,664,994 B1
(45) Date of Patent: Mar. 4, 2014

(54) SYSTEM TO GENERATE A PREDETERMINED FRACTIONAL PERIOD TIME DELAY

(71) Applicants: Department of Electronics and Information Technology, New Delhi (IN); Indian Institute of Science, Bangalore (IN)

(72) Inventors: Bharadwaj Amrutur, Bangalore (IN); Pratap Kumar Das, Bangalore (IN)

(73) Assignees: Department of Electronics and Information Technology, New Delhi (IN); Indian Institute of Science, Bangalore (IN)

( * ) Notice: Subject to any disclaimer, the term of this patent is extended or adjusted under 35 U.S.C. 154(b) by 0 days.

(21) Appl. No.: 13/790,002

(22) Filed: Mar. 8, 2013

(30) Foreign Application Priority Data

Oct. 10, 2012 (IN) .......................... 4212/CHE/2012

(51) Int. Cl.
*H03H 11/26* (2006.01)
(52) U.S. Cl.
USPC .......................................... 327/261; 327/284
(58) Field of Classification Search
None
See application file for complete search history.

(56) References Cited

U.S. PATENT DOCUMENTS

| 5,892,384 | A * | 4/1999 | Yamada et al. | 327/277 |
| 6,993,109 | B2 * | 1/2006 | Lee et al. | 375/376 |
| 7,154,322 | B2 * | 12/2006 | Kim | 327/276 |
| 8,542,045 | B2 * | 9/2013 | Na et al. | 327/175 |
| 2010/0001777 | A1 * | 1/2010 | Brantley et al. | 327/261 |

OTHER PUBLICATIONS

Amiri et al., A Multihit Time-to-Digital Converter Architecture on FPGA, IEEE Transactions on Instrumentation and Measurment, Mar. 2009, 530-540, 58-3.
Amrutur et al., 0.84 ps. Resolution Clock Skew Measurement via Subsampling, IEEE Transactions on Very Large Scale Integration (VLSI) Systems, Dec. 2011, 2267-2275, 19-12.
Bhatti, et al., Duty Cycle Measurement and Correction Using a Random Sampling Technique, Proc. IEEE Int. Midwest Symp. Circuits Syst., 2005, 1043-1046, vol. 2.
Cdcf5801a Data Sheet: Clock Multiplier with Delay Control and Phase Alignment, Texas Instruments, Mar. 2006.
Chen et al., FPGA Vernier Digital-to-Time Converter With 1.58 ps. Resolution and 59.3 Minutes Operation Range, IEEE Transactions on Circuits and Systems-I: Regular Papers, Jun. 2010, 1134-1142, vol. 57, No. 6.
Christiansen, An Integrated High Resolution CMOS Timing Generator Based on an Array of Delay Locked Loops, IEEE Journal of Solid-State Circuits, Jul. 1996, 952-957, vol. 31, No. 7.

(Continued)

*Primary Examiner* — Cassandra Cox
(74) *Attorney, Agent, or Firm* — The Webb Law Firm

(57) ABSTRACT

Embodiments of the disclosure relate to an all-digital technique for generating an accurate delay irrespective of the inaccuracies of a controllable delay line. A sub-sampling technique based delay measurement unit capable of measuring delays accurately for the full period range is used as the feedback element to build accurate fractional period delays based on input digital control bits. The delay generation system periodically measures and corrects the error and maintains it at the minimum value without requiring any special calibration phase. A significant improvement in accuracy is obtained for a commercial programmable delay generator chip. The time-precision trade-off feature of the delay measurement unit is utilized to reduce the locking time. Loop dynamics are adjusted to stabilize the delay after the minimum error is achieved, thus avoiding additional jitter.

11 Claims, 9 Drawing Sheets

(56) References Cited

OTHER PUBLICATIONS

Daigneault et al., A High-Resolution Time-to-Digital Converter on FPGA Using Dynamic Reconfiguration, IEEE Transactions on Instrumentation and Measurment, Jun. 2011, 2070-2079, vol. 60, No. 6.

Das et al., On-Chip Clock Network Skew Measurement using Sub-Sampling, IEEE Asian Solid-State Circuits Conference, Nov. 2008, pp. 401-404.

Fick et al., In Situ Delay-Slack Monitor for High-Performance Processors Using An All-Digital Self-Calibrating 5 ps Resolution Time-to-Digital Converter, IEEE International Solid-State Circuits Conference, 2010, pp. 188-190.

Hanumolu et al., A Sub-Picosecond Resolution 0.5-1.5 GHz Digital-to-Phase Converter, IEEE Journal of Solid-State Circuits, Feb. 2008, 414-424, vol. 43, No. 2.

Kalisz et al., Field-Programmable-Gate-Array-Based Time-to-Digital Converter with 200-ps Resolution, IEEE Transactions on Instrumentation and Measurment, Feb. 1997, 51-55, vol. 46, No. 1.

Lee et al., A Sub-10-ps Multiphase Sampling System Using Redundancy, IEEE Journal of Solid-State Circuits, Jan. 2006, 265-273, vol. 41, No. 1.

Nagaraj et al., A Self-Calibrating Sub-Picosecond Resolution Digital-to-Time Converter, IEEE MTT-S Int. Microw. Symp., Jun. 2007, pp. 2201-2204.

Pavlovic et al., A 5.3 GHz Digital-to-Time-Converter-Based Fractional-N All-Digital PLL, IEEE International Solid-State Circuits Conference Dig. Tech. Papers, 2011, pp. 54-56.

Rashidzadeh et al., An All-Digital Self Calibration Method for a Vernier-Based Time-to-Digital Converter, IEEE Transactions on Instrumentation and Measurment, Feb. 2010, 463-469, vol. 59, No. 2.

Roberts et al., A Brief Introduction to Time-to-Digital and Digital-to-Time Converters, IEEE Transactions on Circuits and Systems-II: Express Briefs, Mar. 2010, 153-157, vol. 57, No. 3.

Taillefer et al., Delta-Sigma A/D Conversion Via Time-Mode Signal Processing, IEEE Transactions on Circuits and Systems-I: Regular Papers, Sep. 2009, 1908-1920, vol. 56, No. 9.

Vasudevamurthy et al., A Mostly-Digital Analog Scan-out Chain for Low Bandwidth Voltage Measurement for Analog IP Test, Proc. IEEE Int. Symp. Circuits Syst., 2011, pp. 2035-2038.

Wu et al., A precise delay generator circuit using the average delay technique, Proc. IEEE Int. Symp. VLSI Des., Autom. Test (VLSI-DAT), 2008, pp. 236-239.

\* cited by examiner

SYSTEM TO GENERATE A PREDETERMINED FRACTIONAL PERIOD TIME DELAY

TECHNICAL FIELD

Embodiments of the present disclosure relate to generating a target delay. More particularly, the embodiments relate to a delay generation system for a periodic input signal which periodically measures and tries to correct any error and maintains the error at a minimum value without requiring any separate calibration phase.

BACKGROUND

Presently, the existing methods for multiple phase generation can be classified into two broad categories i.e. locking based and calibration based methods. The locking based approach uses a DLL to lock to a phase of $2\pi$ through a set of controllable delay buffers. The delay buffers can be controlled by an analog voltage or a digital setting. Since the minimum delay that can be achieved from a buffer is quite coarse, interpolators are used to get resolution less than minimum gate delay. In all these architectures, circuit innovations are done to generate delays with good resolution by keeping the sub-phases as much close to each other as possible. But with increasing process variability, it becomes difficult to maintain the accuracy and resolution at the same time.

FIG. 1 shows a block diagram of a system for generating delays. The delay of the signals tapped at the end of first, second ... Nth stage with respect to the feedback point (X) is $D_1, D_2, \ldots, D_N$ respectively. Due to local mismatch among the delay stages, the delay step added by each stage will vary. To quantify that effect, a simple mathematical model of the system is constructed. The delay of each stage ($\tau_i$) can be split to have a global component $\tau_0$ (constant across all stages) and a local random component $\delta T_i$. The $\delta T_i$ s are assumed to be independent and identically distributed (i.i.d.) having a Gaussian distribution with zero mean and standard deviation $\sigma[\delta T]$.

Hence, the delay of the $i^{th}$ stage can be written as:

$$\tau_i = \tau_0 + \delta T_i \quad (1)$$

The delay for the signal tapped after $i^{th}$ stage i.e. $D_i$ will now be given by:

$$D_i = \sum_{k=1}^{i} \tau_k = i\tau_0 + \sum_{j=1}^{i} \delta T_j \quad (2)$$

The delay for the signal tapped after $N^{th}$ stage is $$D_N = \sum_{k=1}^{N} \tau_k = N\tau_0 + \sum_{j=1}^{N} \delta T_j \quad (3)$$

Since the delay at the end of the $N^{th}$ stage is kept constant by the Phase detector (PD) and Charge pump (CP) to the match input clock period, $D_N$ is fixed and $\tau_0$ is adjusted by the loop to make $$\tau_0 = \frac{D_N - \sum_{j=1}^{N} \delta T_j}{N} \quad (4)$$

The variance of the delay at the tapping point is given by:

$$\mathrm{Var}[D_i] = i*(N-i)/N \, \mathrm{Var}[\delta T] \quad (5)$$

which peaks for $i=N/2$ and the peak value of the uncertainty in terms of standard deviation is given by $$\mathrm{Max}\{\sigma[D_i]\} = \frac{\sqrt{N}}{2}\sigma[\delta T] \quad (6)$$

FIG. 2 shows the standard deviation of the generated delays across i for a period ($D_N$) of 5 ns, N=100 and $\sigma[\delta T]$=4 ps. It is found that in conventional DLL based techniques, the delay at the extreme ends of the delay chain are checked using a phase detector. However, if the desired delay is farther from the two ends of the chain, the accuracy degrades as shown in FIG. 2. Therefore, an ideal architecture would use actual generated delay itself in a feedback to ensure accuracy.

Also, the conventional techniques use two PLLs with small frequency offsets to generate precise one-shot delays. But the technique is specifically oriented towards generating one-shot delays proportional to the digital code word and cannot be applied for fractional periodic delay generation. Most of the calibration based approaches use a separate calibration phase to reduce the error. Therefore, they can't be adopted for applications requiring uninterrupted signal to be available for a long time. Moreover, with slow temperature variations, the delays generated by these calibration based systems can change causing an increase in error. Some calibration based approaches generate a physical signal to calibrate the generated delayed signal against a reference. For example, in one of the known technique a high resolution TDC within a FPGA using dynamic reconfiguration where a variable frequency oscillator is used for the calibration to ensure the accuracy of the intermediate step delays against temperature variation and mismatch. In the calibration phase, the variable frequency generator is used to generate the reference signal whose phase is compared with each of the delay elements to find the nearest delay stage for a required delay. The frequency of the variable frequency oscillator drifts with time due to increase in temperature making re-calibration necessary at regular intervals when the system needs to be put on hold. The hardware required and time required for calibration process is also relatively high.

Further, another conventional technique uses a high resolution digital to time converter where an integrated Dual Mixer Time Domain (DMTD) circuit is adopted to overcome device mismatch, process variations and temperature for self-calibration during normal operation. Similarly, an on-chip measurement and continuous correction methods for correcting output duty cycle where random sampling technique is used for delay estimation. However, no experiment result is demonstrated for the aforementioned techniques to reveal the actual performance of the PDG. Also, these techniques use a conventional XOR based approach which can give an erroneous estimate for skews around zero in the presence of jitter.

A technique to provide solution to all these problems, and to enable a continuous closed loop feedback ensuring good accuracy in achieving a desired fractional period delay with little area overhead is required.

REFERENCES

[1] P. Chen, P.-Y. Chen, J.-S. Lai, and Y.-J. Chen, "FPGA vernier digital-to-time converter with 1.58 ps resolution and 59.3 minutes operation range," IEEE Trans. Circuits Syst. I, Reg. Papers, vol. 57, no. 6, pp. 1134-1142, June 2010.

[2] P. K. Hanumolu, V. Kratyuk, G.-Y. Wei, and U.-K. Moon, "A sub-picosecond resolution 0.5-1.5 GHz digital-to-phase converter," IEEE J. Solid-State Circuits, vol. 43, no. 2, pp. 414-424, February 2008.

[3] R. Bhatti, M. Denneau, and J. Draper, "Duty cycle measurement and correction using a random sampling technique," in Proc. IEEE Int. Midwest Symp. Circuits Syst., 2005, vol. 2, pp. 1043-1046.

[4] G. W. Roberts and M. A. Bakhshian, "A brief introduction to time-to-digital and digital-to-time converters," IEEE Trans. Circuits Syst. II, Exp. Briefs, vol. 57, no. 3, pp. 153-157, March 2010.

[5] C. S. Taillefer and G. W. Roberts, "Delta-sigma A/D conversion via time-mode signal processing," IEEE Trans. Circuits Syst. I, Reg. Papers, vol. 56, no. 9, pp. 1908-1920, September 2009.

[6] V. Rajath, P. K. Das, and B. Amrutur, "A mostly-digital analog scan-out chain for low bandwidth voltage measurement for analog IP test," in Proc. IEEE Int. Symp. Circuits Syst., 2011, pp. 2035-2038.

[7] N. Pavlovic and J. Bergervoet, "A 5.3 GHz digital-to-time-converter-based fractional-N all-digital PLL," in Proc. IEEE Int. Solid-State Circuits Conf. Dig. Tech. Papers, 2011, pp. 54-56.

[8] J. Christiansen, "An integrated high resolution CMOS timing generator based on an array of delay locked loops," IEEE J. Solid-State Circuits, vol. 31, no. 7, pp. 952-957, July 1996.

[9] H.-Y. Wu, C.-C. Chen, C.-P. Wu, and H.-W. Tsao, "A precise delay generator circuit using the average delay technique," in Proc. IEEE Int. Symp. VLSI Des., Autom. Test (VLSI-DAT), 2008, pp. 236-239.

[10] L.-M. Lee, D. Weinlader, and C.-K. K. Yang, "A sub-10-ps multiphase sampling system using redundancy," IEEE J. Solid-State Circuits, vol. 41, no. 1, pp. 265-273, January 2006.

[11] M.-A. Daigneault and J. P. David, "A high-resolution time-to-digital converter on FPGA using dynamic reconfiguration," IEEE Trans. Instrum. Meas., vol. 60, no. 6, pp. 2070-2079, June 2011.

[12] R. Rashidzadeh, M. Ahmadi, and W. C. Miller, "An all-digital self calibration method for a vernier-based time-to-digital converter," IEEE Trans. Instrum. Meas., vol. 59, no. 2, pp. 463-469, February 2010.

[13] A. M. Amiri, M. Boukadoum, and A. Khouas, "A multi hit time-to-digital converter architecture on FPGA," IEEE Trans. Instrum. Meas., vol. 58, no. 3, pp. 530-540, March 2009.

[14] J. Kalisz, R. Szplet, J. Pasierbinski, and A. Poniecki, "Fieldprogrammable-gate-array-based time-to-digital converter with 200-ps resolution," IEEE Trans. Instrum. Meas., vol. 46, no. 1, pp. 51-55, February 1997.

[15] G. Nagaraj, S. Miller, B. Stengel, G. Cafaro, T. Gradishar, S. Olson, and R. Hekmann, "A self-calibrating sub-picosecond resolution digital-to-time converter," in Proc. IEEE MTT-S Int. Microw. Symp., June 2007, pp. 2201-2204.

[16] B. Amrutur, P. K. Das, and R. Vasudevamurthy, "0.84 ps resolution clock skew measurement via subsampling," IEEE Trans. Very Large Scale Integr. (VLSI) Syst., vol. 19, no. 12, pp. 2267-2275, December 2011.

[17] D. Fick, N. Liu, Z. Foo, M. Fojtik, J.-S. Seo, D. Sylvester, and D. Blaauw, "In situ delay-slack monitor for high-performance processors using an all digital self-calibrating 5 ps resolution time-to-digital converter," in Proc. IEEE Int. Solid-State Circuits Conf. Dig. Tech. Papers, 2010, pp. 188-189.

[18] P. K. Das, B. Amrutur, J. Sridhar, and V. Visvanathan, "Onchip clock network skew measurement using sub-sampling," in Proc. IEEE Asian Solid-State Circuits Conf., 2008, pp. 401-404.

[19] Cdcf5801a Data Sheet: Clock Multiplier with Delay Control and Phase Alignment, Texas Instruments.

SUMMARY

The shortcomings of the prior art are overcome and additional advantages are provided through the provision of systems and methods of the present disclosure.

Additional features and advantages are realized through various techniques provided in the present disclosure. Other embodiments and aspects of the disclosure are described in detail herein and are considered as part of the claimed disclosure.

In one embodiment, the disclosure provides a system to generate a predetermined fractional period delay in an integrated circuit. The system comprises a controllable delay line block with a predefined number of taps to generate a target/desired delay output for an input clock signal. Also, the system comprises a sampling block to sample the input clock and the delayed output to generate sub-sampled signals corresponding to the input and delayed output signals. Further, the system comprises a delay measurement unit (DMU) which processes the sub-sampled signals to generate the required parameters to close the loop which are: measured delay count proportional to the actual delay and period count value proportional to the period of the input clock signal. The system also includes a delay control unit (DCU) to receive the estimated parameters from the DMU and predefined user input data. The delay control unit generates tap values which in turn are used to adjust the taps of the controllable delay line to generate the predetermined time delay.

In one embodiment, the disclosure provides a method of generating a predetermined time delay. The method comprises a controllable delay line block which obtains a delayed output clock for an input clock signal. The taps of the delay line block are adjusted to a value determined by a closed loop controller action. Also, the method comprises sampling of the input signal and the output clock signal using a predefined sampling clock for the obtained sub-sampled signals. Further, a delay count (proportional to input delay) and a period count (proportional to period of input clock) is obtained using a delay measurement unit from the sub-sampled signals and a copy of sampling clock. Further, the method comprises generating a tap value using the sub-sampled signals and predefined input data setting the desired delay. A delay measurement unit is used for generating the tap value. The method also comprises configuring the taps of the controllable delay line block using the tap value, thereby generating the desired time delay.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE ACCOMPANYING DRAWINGS

The novel features and characteristic of the disclosure are set forth in the appended claims. The embodiments of the disclosure itself, however, as well as a preferred mode of use, further objectives and advantages thereof, will best be understood by reference to the following detailed description of an illustrative embodiment when read in conjunction with the accompanying drawings. One or more embodiments are now described, by way of example only, with reference to the accompanying drawings wherein like reference numerals represent like elements and in which:

The figures depict embodiments of the disclosure for purposes of illustration only. One skilled in the art will readily recognize from the following description that alternative embodiments of the structures and methods illustrated herein may be employed without departing from the principles of the disclosure described herein.

DETAILED DESCRIPTION

The foregoing has broadly outlined the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

Exemplary embodiments of the present disclosure provide system and method for generating a predetermined fractional period delay in an integrated circuit, irrespective of any non linearity in the delay chain.

In one embodiment, a digital technique is used to generate an accurate delay irrespective of any inaccuracies in a controllable delay line. A sub-sampling technique based delay measurement unit which is capable of measuring delays accurately for the full period range is used as the feedback element to build accurate fractional period delays based on input digital control bits. The delay generation system periodically measures and corrects the error and maintains it at the minimum value without requiring any special calibration phase. Up to 40× improvement in accuracy is obtained and demonstrated for a commercial programmable delay generator chip. The time-precision trade-off feature of the delay measurement unit is utilized to reduce the locking time. Loop dynamics are adjusted to stabilize the delay after the minimum error is achieved, thus avoiding additional jitter. Measurement results from a high-end oscilloscope also validate the effectiveness of the proposed system in improving accuracy.

Figure 1:
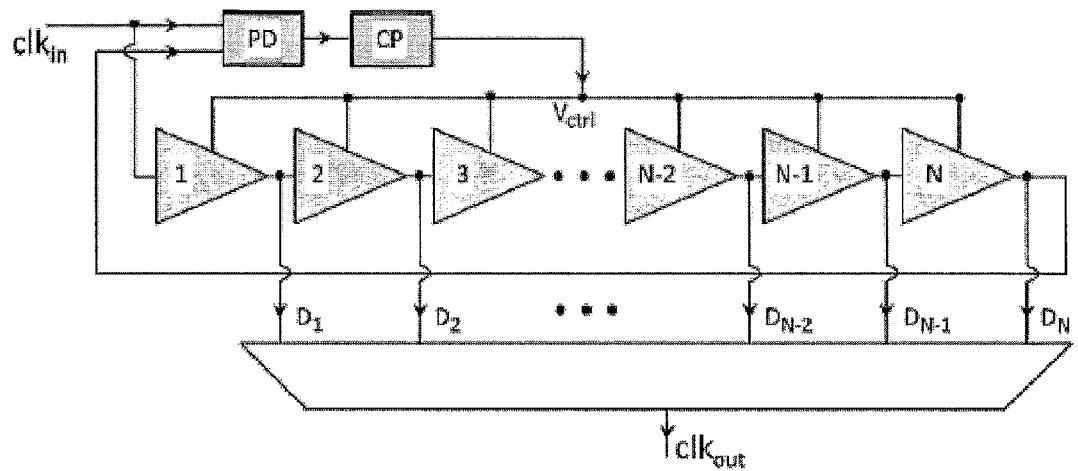
FIG. 1 shows a fractional period delay generating system, in accordance with prior art.
Figure 2:
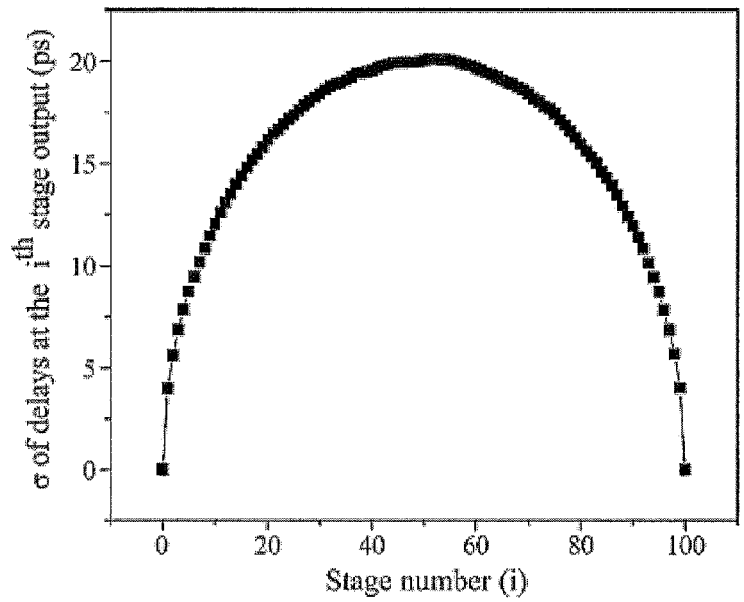
FIG. 2 shows the standard deviation of the generated delays across various buffer stages in FIG. 1.
Figure 3:
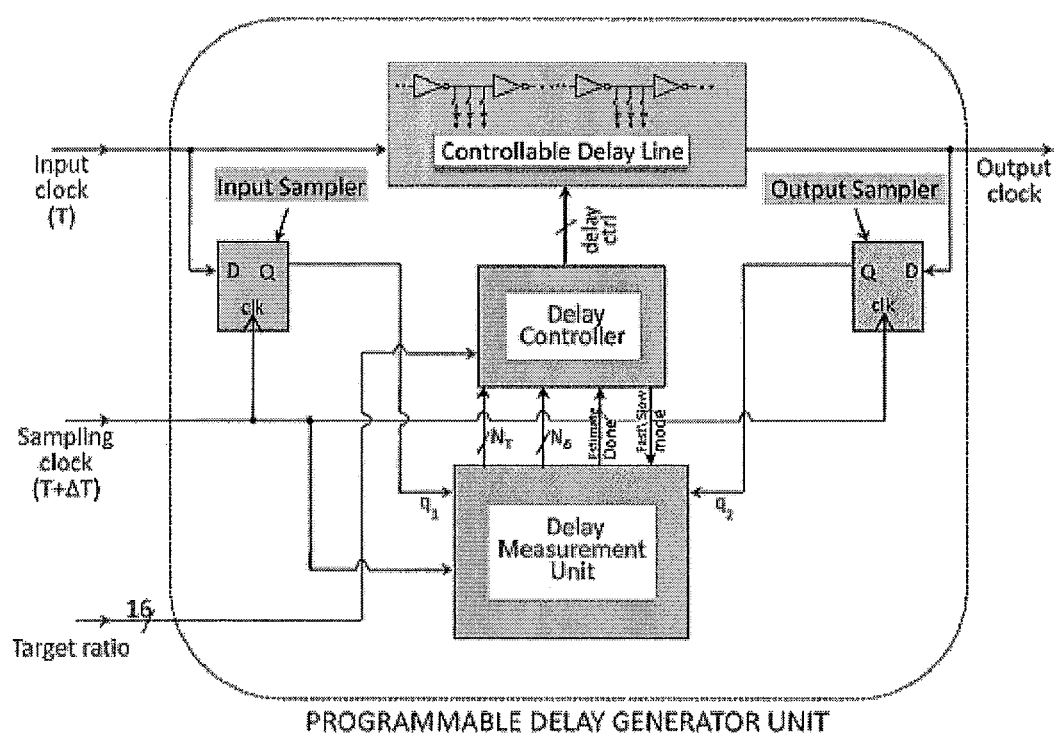
FIG. 3 shows the system block diagram using feedback action to generate fractional period delay, in accordance with an exemplary embodiment.

FIG. 3 shows a block diagram of the delay generation system using a feedback based scheme for generating a predetermined fractional delay, in one embodiment. The delay generation system consists of three major blocks delay measurement unit (DMU), delay controller (DC) and controllable delay line (CDL). The DMU estimates the actual on-chip delay between the input and delayed output in terms of a proportional count value. This count value is used by the delay controller to close the feedback loop by generating appropriate control signals for the controllable delay line.

The DMU is based on sub-sampling principle to measure precise delay. In the DMU, the input and delayed output signals are sub-sampled using an asynchronous clock signal which is having a small frequency offset with respect to the input signal frequency. The signals coming out of the samplers are called beat signals which are of very low frequency i.e. equal to the difference of the input clock frequency and sampling clock frequency. The beat signals are processed in a DMU which does the required processing and averaging to estimate the input skew precisely. With the sub-sampling phenomenon the beat signals are synchronous to the sampling clock and all the measured delays are in terms of some counter values ($N_\delta$) which can be multiplied with $\Delta T$, where $\Delta T$ is the difference between periods of the input and sampling clock, to extract the absolute time units. The measured delay ($N_\delta$) is sampled by the delay controller unit at an interval when the estimate of delay is ready.

The delay controller or control unit uses the estimate to control the delay chain to increase or decrease the delay in the signal path to converge for making the difference between the target delay and the generated delay to the minimum possible value. The target delay is computed from the target ratio i.e. of target delay to the clock period provided as the input to the control unit, by multiplying the period count ($N_T$) from the delay measurement unit with the target ratio. The delay measurement unit is configured to run in two modes (fast/slow) depending on the difference between the measured delay and the target delay. The mode signal is provided by the delay controller unit. The delay controller also provides the required signals to activate the controllable delay line to converge towards the target delay and maintain the error to be as small as possible.

In one embodiment, the controllable delay line can be of any architecture to provide precise delay steps for the input digital code word. For example, it can take the shape of a simple inverter and RC chain based delay line structure providing a coarse fine architecture.

Figure 4:
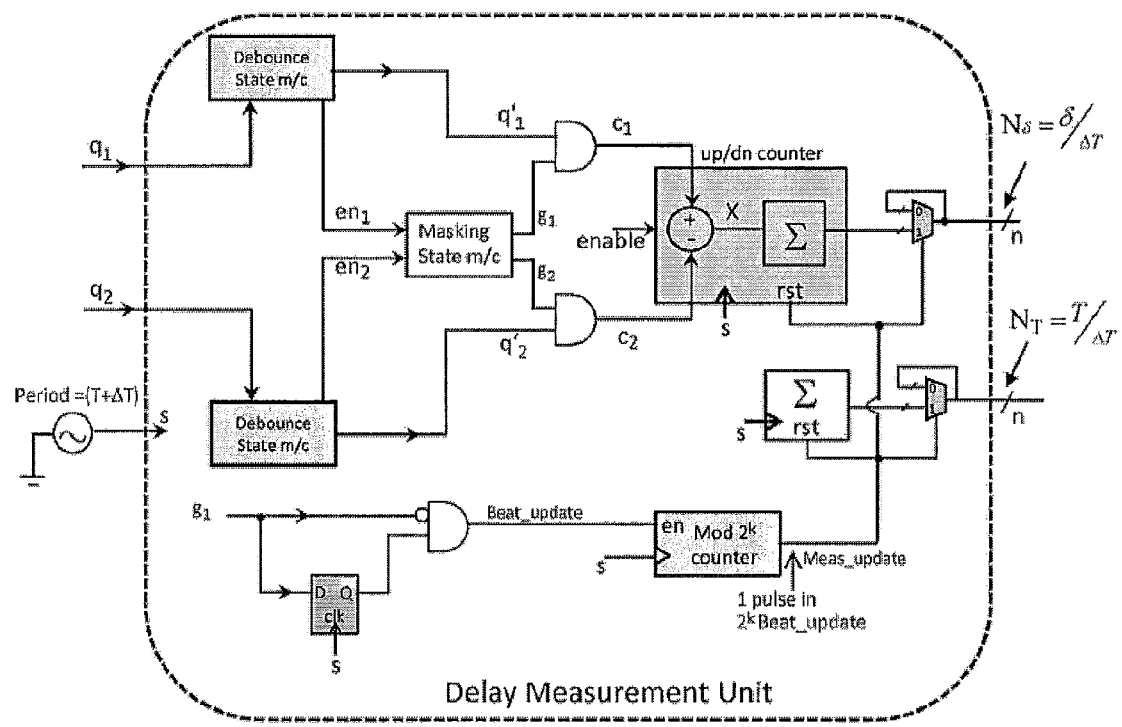
FIG. 4 shows block diagram of the delay measurement unit, in accordance with an alternative embodiment.

FIG. 4a shows the delay measurement unit (DMU) as one embodiment. The inputs to the DMU are periodic in nature. A very precise measurement can be performed using the method of sub-sampling which takes advantage of the periodic natures of the inputs to simplify the hardware requirements. The sub-sampled signals $g_1$ and $q_2$ as shown in FIG. 3 corresponding to the input and the delayed output signals from the delay generation unit are routed to the DMU for an accurate estimation of the skew. The sampling clock period is $T_s=T+\Delta T$ is slightly greater than the input signal. The output of the two samplers i.e. at the input and output will be beat signals whose period is $T_s \times T/\Delta_T$, which is essentially the sampling clock period amplified by a factor $T/\Delta T$. The input skew ($\delta$) is amplified as a skew between the sub-sampled outputs to be $\delta/\Delta T \times T_s$. The skew in terms of $\Delta T$, i.e. $S_k=\delta/\Delta T$ is digitally measured by the delay measurement unit. Similarly the input clock period is also estimated in terms of $\Delta T$, i.e. $S_k$.

The sampling clock can be generated in one of two ways. It can be derived from a separate crystal which generates close frequency to the input clock. The frequency of the crystal is chosen such that even with drifts and manufacturing uncertainties, the sampling clock frequency always falls below the test clock frequency. Since the references are independent, the clocks will be asynchronous. Another technique is to derive the sampling clock from the input clock using a PLL to obtain a ratio P/Q, with P and Q integers close together, and P~Q. While this will make them rationally related, a further frequency modulation allows for accurate and precise measurements similar to those obtained using asynchronous clocks.

Figure 5:
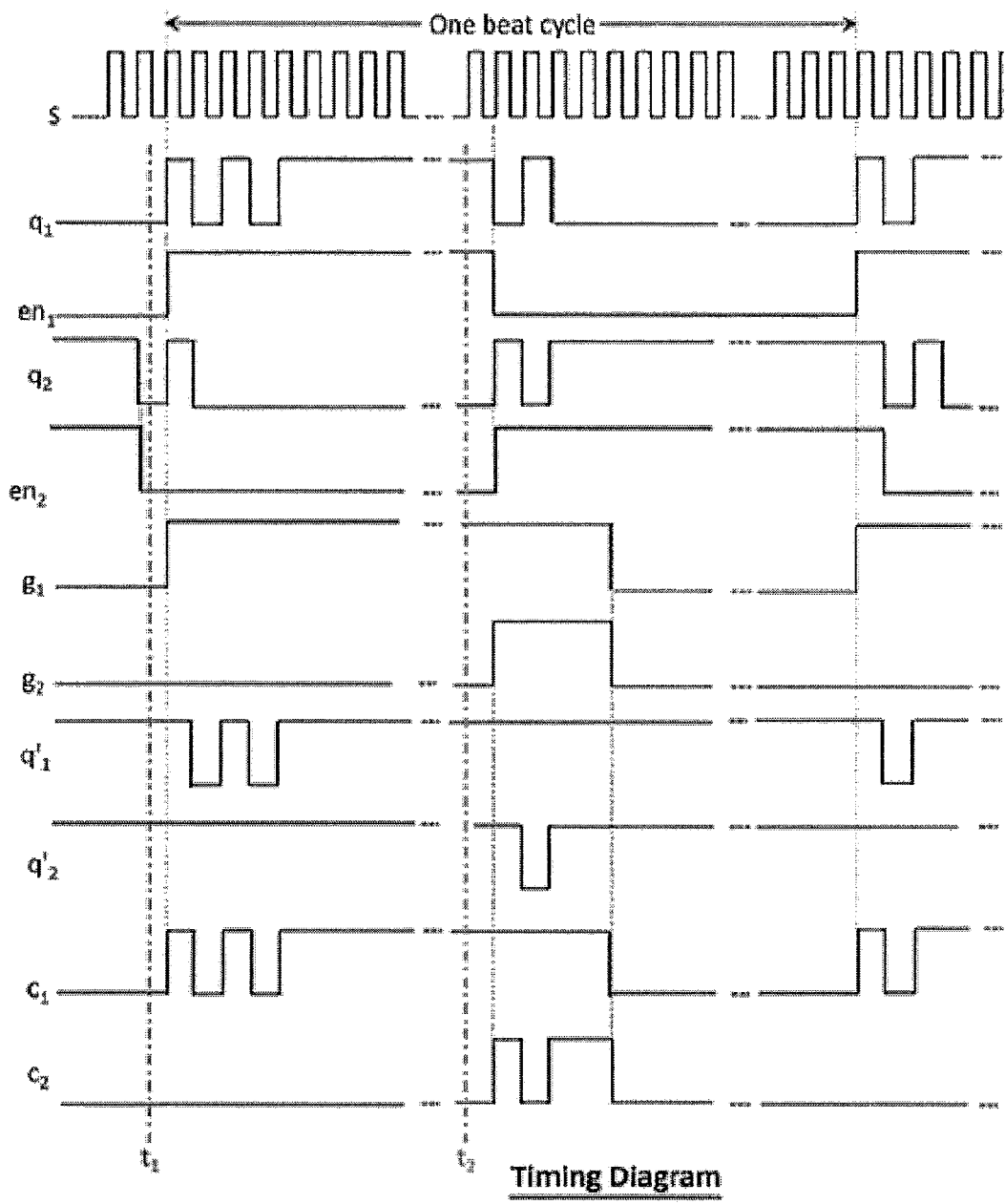
FIG. 5 shows timing diagrams for various signals in the skew estimation unit, in accordance with one embodiment.

As shown in FIG. 4a, the DMU architecture for measuring the actual skew between the input and output of the system from the sub-sampled signals $q_1$ and $q_2$. In a digital sub-sampling system due to jitter, finite rise-time of the signals and the meta-stability of the samplers, the outputs will have bounces between the digital values as shown in FIG. 5. In order to find the skews for only one polarity of edges of the inputs, the sampled signals corresponding to the falling edges have to be mask out. Hence, the sub-sampled signals with bouncing have to be processed to mask out the falling edge statistics to give $c_1$ and $c_2$. The difference between $c_1$ and $c_2$ is accumulated in a counter for $2^k$ beat cycles to obtain the digital code word for $\delta/\Delta T$ or $N_\delta$. Similarly, another accumulator accumulates sampling clock cycles in the measurement time to give an estimate of $T/\Delta_T$ or $N_T$. $\delta/T$ which is then equal to $N_\delta/N_T$. The masking of falling edges is done via two state machines, as shown in FIG. 4b and FIG. 4c. The timing waveforms of the signals used in the state machines are also sketched in FIG. 5.

FIG. 4b shows de-bounce state machine of the de-bounce module used in the DMU. The de-bounce state machine generates signals $en_1$ and $en_2$, having a single rising and falling edge in a beat cycle from the input beat signals $q_1$ and $q_2$. The generated signals $en_1$ and $en_2$ are used by the masking state machine to generate the signals $g_1$ and $g_2$ which are used for generating $c_1$ and $c_2$ which are used in the up/down counter to estimate the skew. The de-bounce state machine also generates signals $q_1'$ and $q_2'$ which are used to generate the signals $c_1$ and $c_2$ as shown in FIG. 4a. To ensure that the $en_1$ and $en_2$ do not incorrectly get triggered by the falling bouncing edges of $q_1$ and $q_2$ near the legitimate rising edge or vice versa, the starting levels of $en_1$ and $en_2$ are enabled after counting the continuous run of zeros or ones till a timer counts till a threshold value. After initialization, the de-bounce state machine detects the first rising edge on the sampler outputs $q_1$ and $q_2$ asserts the signals $en_1$ and $en_2$ respectively to cover for the high duration of the beat signals $q_1$ and $q_2$. The high duration of the beat signal is determined by a timer clocked by the sampling clock. After the count value of the timer crosses the threshold, $en_1$ and $en_2$ will follow $q_1$ and $q_2$ until the first falling edges of $q_1$ and $q_2$ are detected. During the duration when $en_1$ and $en_2$ are high, the signals $q_1'$ and $q_2'$ follow the input signals $q_1$ and $q_2$, and are tied high when $en_1$ and $en_2$ become zero. The mask signals $g_1$ and $g_2$ rise on the rising edge of $en_1$ and $en_2$ respectively. From the time of observation, which ever signal of $en_1$ or $en_2$ rises first, waits for the other to rise too and count till a threshold. As soon as threshold count for the one which starts later is reached, both $g_1$ and $g_2$ are de-asserted which in turn de-assert $c_1$ and $c_2$ simultaneously. The signals $c_1$ and $c_2$ contain only the rising edge information for the original signals, which are sub-sampled, and hence their histogram analysis gives the rising edge statistics. The behavior of the masking state machine is similar to that of a conventional phase frequency detector. The value set for the threshold count value is depends on $N_T$ which is set to 16 in one embodiment. The said value works for all values of $N_T$ within the range 100 to 1000.

FIG. 4c shows masking module which makes the DMU works seamlessly across the full range from $-(N_T/2)$ to $N_T/2$. In a closed loop system, any discontinuity point in the feedback block can make the system unstable. Hence, the DMU stands out in that aspects to provide the vital element in the programmable delay generation system. Based on the initial condition, the estimated skew can be measured as positive or negative depending on whether $g_1$ triggers the counter or $g_2$. As shown in FIG. 5, if the measured skew is denoted as $N_\delta$ and DMU starts operating from the time instance $t_1$, then for the starting time instance $t_2$, the same skew will be measured as $-(N_T-N_\delta)$. Since, the counting happens with respect to $q_2$ in the latter case, there are instances where there can be erroneous output within the first two beat cycles. Hence, the up or down counter of the DMU is enabled after observing 3 beat cycles.

In one embodiment, the standard deviation (SD) of the estimate from the DMU varies with the number of samples taken for averaging as $$\sigma[N_\delta] \propto \frac{1}{\sqrt{2^{k+1}}} \quad (7)$$

As shown in the equation 7, for lesser number of samples, the precision of the delays measured from DMU will be less. However, the SD can be improved at the cost of higher number of samples and higher measurement time. This feature of the DMU is used to provide less precise results to the controller at faster rate in fast mode and more precise measurements in slow mode by taking a larger time for estimation. Even though the skew and period count is computed with respect to ΔT, the absolute value of ΔT falls within a reasonable range. Hence, as long as the frequency of the sampling clock signal does not drift during a single measurement time, the results obtained would not be affected.

Figure 6:
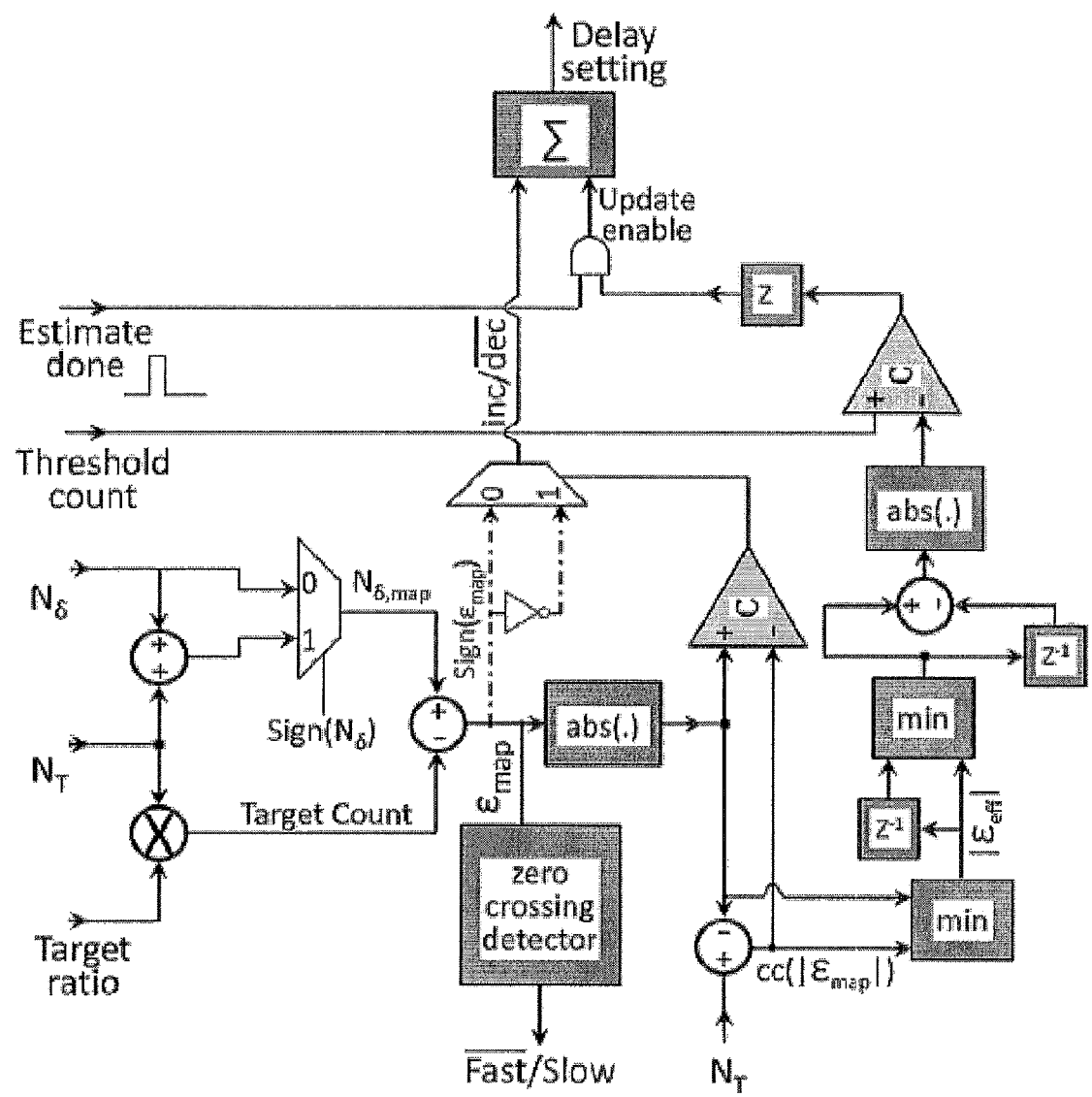
FIG. 6 shows block diagram of the delay control unit, in accordance with an alternative embodiment.

FIG. 6 shows a block diagram of the delay controller unit. The block latches the values of the measured delay ($N_\delta$) and period count ($N_T$) when the signal estimate performs becomes high. Depending on the starting point of the delay estimation unit, $N_\delta$ can take values from $-N_T/2$ to $N_T/2$ or 0 to $N_T$. The desired count is computed by multiplying the input target ratio with $N_T$. The desired ratio is an input fraction taking values in the range [0,1], the target count ($N_{TC}$) values ranges from 0 to T. The comparing the two count values are performed by mapping to the same domain or range. The same is performed by adding $N_T$ to $N_\delta$ if $N_\delta<0$ and the number thus generated is called $N_{\delta,map}$. The numerical difference between the $N_{TC}$ and $N_{\delta,map}$ quantifies the error from the target. But, the computed error may be very high due to the adjustment done to map $N_\delta$ and $N_T$ into same range, for example, when the delay changes from a small positive value to a small negative value or vice-versa. In the said example, a large difference between the absolute values of the errors is observed after mapping, even though they would be very close before mapping.

Figure 7A:
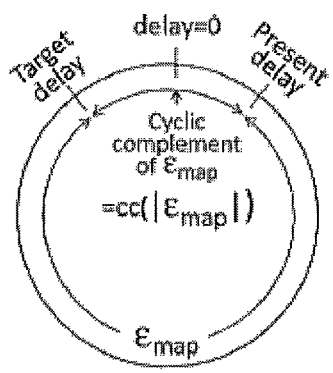
FIG. 7a shows cyclic compliment of error, in accordance with an exemplary embodiment.
Figure 7B:
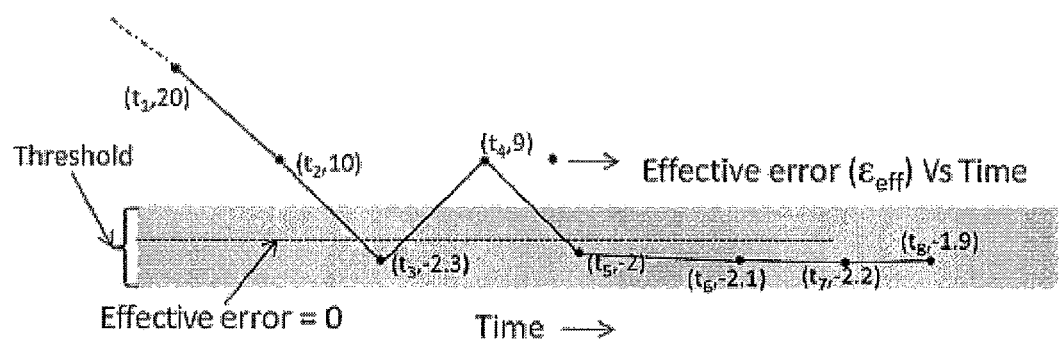
FIG. 7b shows loop dynamics as the error crosses zero, in accordance with an exemplary embodiment.

As shown in FIG. 7, a cyclic complement of the error is computed by taking the complement of absolute value of mapped error ($\grave{o}_{map}$) with respect to $N_T$ along with $\grave{o}_{map}$. The entity having minimum absolute value among them is chosen to be the effective error used for generating the final signals for controlling the delay generation module. The $Z^{-1}$ blocks shown in FIG. 6 provide one measurement cycle delay. The control unit compares the absolute value of the present error with that of the error generated in the last measurement cycle to make the generated delay stable at the same minimum error. If the difference obtained from this comparison is within a threshold distance from its value in the previous measurement instance, it indicates the achievement of minimum error. Hence, the delay enable signal controlling the delay generation unit need not be activated since the minimum error is inferred until the gap between these differences is within the threshold. The threshold is set to be the count value corresponding to the average step size of the delay generating unit. Otherwise, the enable signal is activated to trigger a change in the delay generation unit.

The loop dynamics as the error crosses zero is shown in FIG. 7 and the effective errors are plotted against time. While approaching the minimum from positive side, the effective error takes values 20, 10, −2.3, 9, −2, −2.1, −2.2, −1.9 respectively according to the control loop. The minimum absolute error values estimated during the run are 20, 10, 2.3, 2.3, 2, 2, 2 respectively. Once the sequence of two close values of minimums (2.3, 2.3) is obtained, the enable signal is not activated further and hence a stable delay is maintained. A small variation is expected each time a delay estimate is done due to the fact that skew is time-varying in nature. The direction of change is evaluated based on the sign of the effective error to minimize the difference between the target and the generated delay.

The control unit also controls the speed mode in which the delay measurement unit works. For converging faster to the target, whenever a new target is desired, the control unit selects the fast mode for the DMU so that the DMU takes fewer samples for averaging and hence the estimate done signal pulses come at a faster rate and the delay unit changes the delay more frequently. Once the difference between the target and the generated delays changes sign, measurements are made more precise by entering the slow mode where the DMU takes a larger number of samples for averaging.

Figure 8:
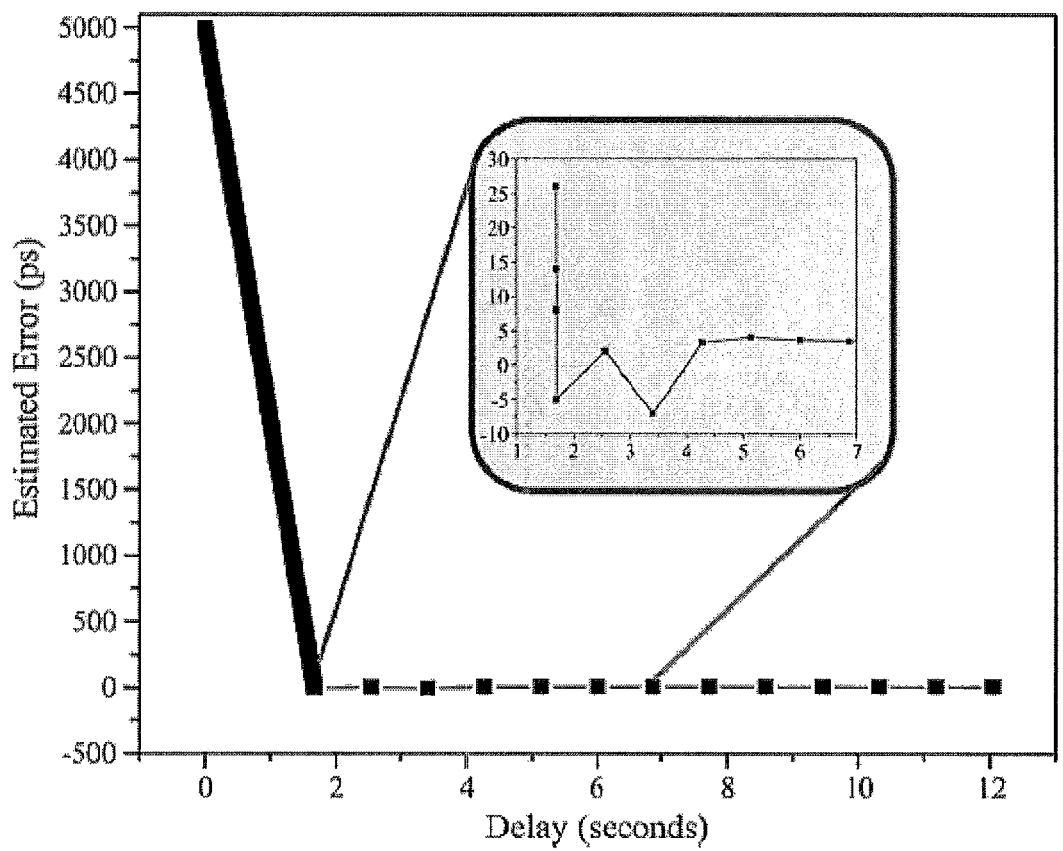
FIG. 8 shows an error plot between time and error for a starting error of 5 ns and delay generation step size of 10 ps with a of local step size mismatch of 0.3 ps, in accordance with an exemplary embodiment.

In one embodiment, FIG. 8 shows loop dynamics of the controller for converge to the minimum possible error. The error is 4 ns for an input period of 10 ns. Since the error value is high, the estimates were done at small time intervals of 3 ins i.e. $2^8$ beat cycles with σ error of ≈6 ps. Once the zero crossing is detected through fast estimation, the controller enters into slow mode, taking $2^{16}$ beat cycles for each measurement to ensure high precision i.e. σ≤0.3 ps and accuracy in the measurement. It can be observed that within approximately 3 seconds, the loop converges to the minimum possible error ≈4 ps even though traversing the maximum possible distance≈T/2. The minimum error achievable is decided by the resolution of the delay chain which is 10 ps, in accordance with an example. The inc/$\overline{dec}$ signal coming out of the controller changes the delay setting through an accumulator.

In one embodiment, delay generation unit generates a delay proportional to the digital code word provided by the delay controller. The delay generation unit is one of coarse-fine architecture, an interpolation based architecture and any other architecture which can increase or decrease the delay of the input clock signal in fine steps. As long as the delay chain is capable of covering the full period, the system can generate delays of any fraction of the input clock period. The resolution of the delay element also limits the accuracy achievable by the proposed closed loop architecture. The delay generation unit should provide uniform and predictable delay steps. However, process variation can cause the step size to vary. Hence, for maintaining high accuracy the delay generation unit should be placed in a closed loop.

Figure 9A:
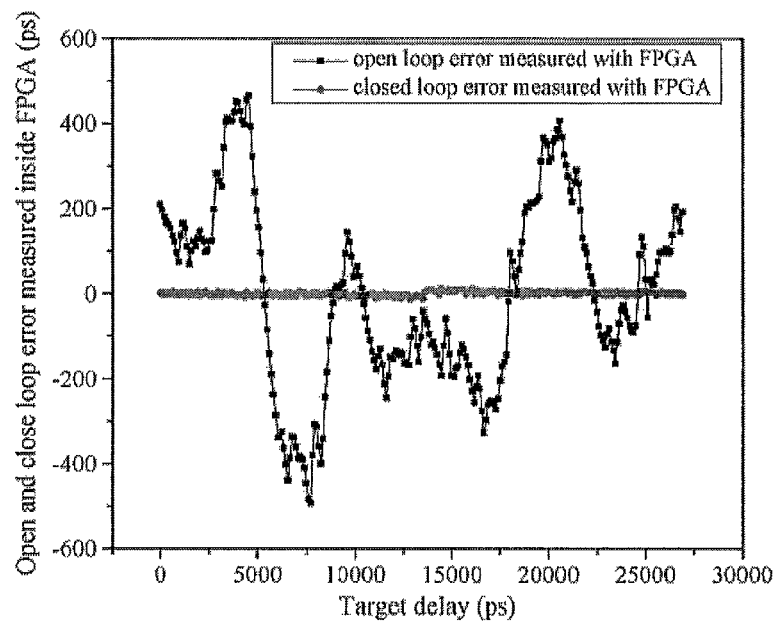
FIG. 9a shows a plot between INL (integral nonlinearity) and desired delay measured by the DMU, in accordance with an exemplary embodiment.
Figure 9B:
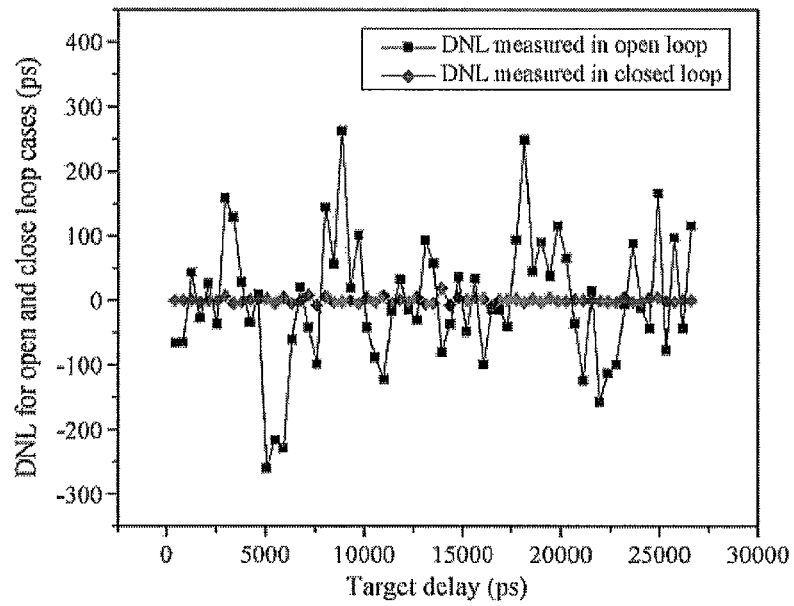
FIG. 9b shows a plot between DNL (differential nonlinearity) and desired delay measured by the DMU, in accordance with an exemplary embodiment.

In one embodiment, a comparison between estimated error with and without implementing the closed loop architecture as an example. In the open loop, to generate any specific delay, the delay chip is triggered for a predetermined times. Since, the initial delay provided by the delay chip along with the routing delays is unknown. Initially, the zero crossing of delay is detected before counting the steps to generate specified delay. In the closed loop case, the difference between the measured and the desired delay (INL) is plotted in FIG. 9a. Similarly, the difference between the measured step sizes between two consecutive settings and the ideal step size (DNL) is shown in FIG. 9b. Although the data points could be plotted in steps of 10 ps, to maintain clarity, the target delays were provided to span the entire period of 27 ns i.e. 37 MHz input clock with 64 steps. The value of sampling clock frequency is 36.927 MHz for the graph shown. By choosing other nearby sampling clock frequencies, the same trend is also observed which proves the insensitivity of the system shown in FIG. 3 to drift in the sampling clock frequency i.e. as an example due to temperature variation. Choosing different input clock frequencies also gives similar results and hence for avoiding redundancy, only one example case is shown. In the fast mode the DMU takes $2^8$ beat cycles for each measurement, whereas it takes $2^{16}$ cycles in slow mode. A precision of about 1 ps is ensured in the slow mode by taking $2^{16}$ beat cycles for averaging. Upto 26× improvement in DNL and 40× improvement in INL accuracy is measured using the system as shown in FIG. 3.

Figure 10:
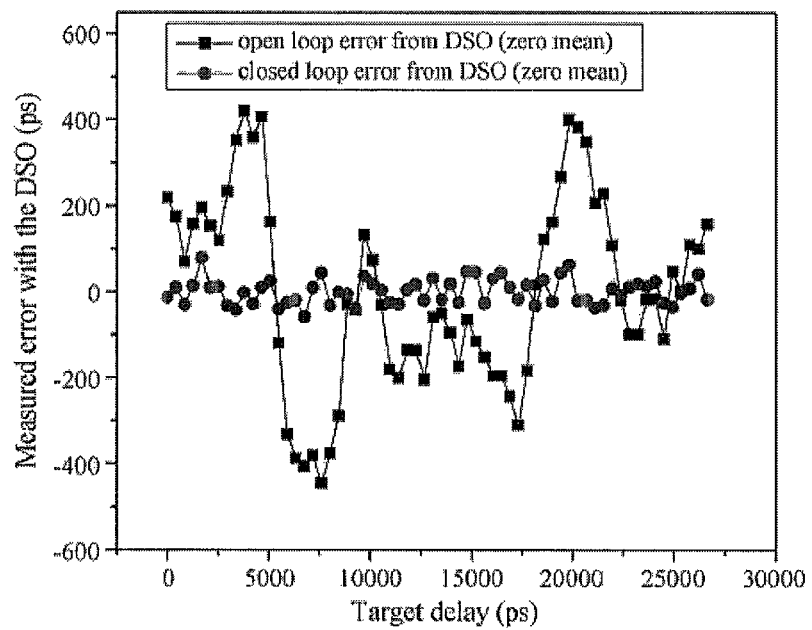
FIG. 10 shows measured normalized errors of the system with and without enabling the closed loop, in accordance with an exemplary embodiment.

In one embodiment, the measured delay is cross checked through the DMU. A copy of the input clock and the delayed output clock signal are taken to a high end oscilloscope. FIG. 10 shows the error measured by the oscilloscope. The maximum error measured by the oscilloscope is more than the DMU readings because of the fact that, in case of the oscilloscope the number of continuous samples taken is quite less.

An uncertainty of the order of tens of pico-seconds is obtained at the input of the scope for multiple readings for a fixed setting. When measured with the oscilloscope, the error decreases by 6× for the present system.

Figure 11:
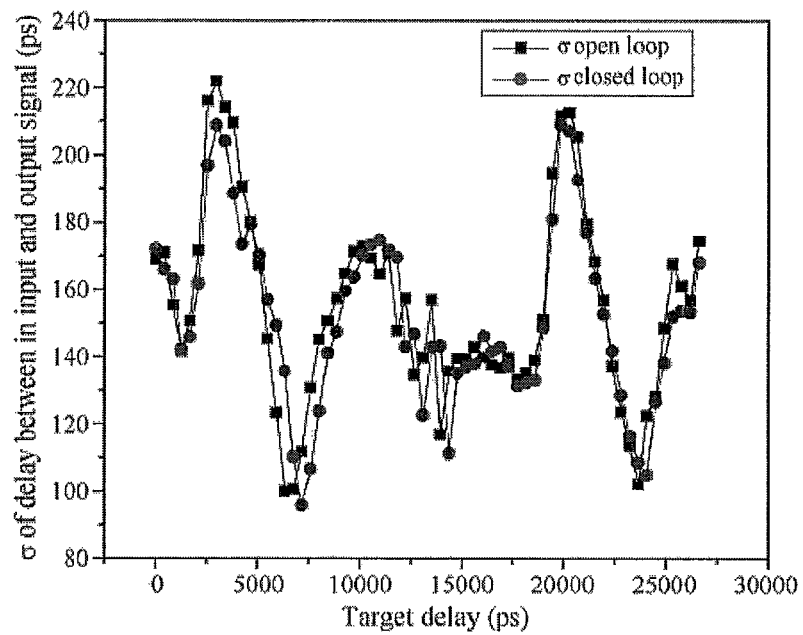
FIG. 11 shows measured jitter at the output of the delay generating system, in accordance with an exemplary embodiment.

FIG. 11 shows the measured jitter of the delayed output clock with and without the closed loop activated. Both the curves take similar shape proving that there is negligible additional jitter added due to the loop. This is care taken in the control unit to avoid multiple switching of delays even though the minimum error is achieved. Since the delay is linearly incremented or decremented through the delay element, the time taken to lock to a desired delay is linearly proportional to the distance of the present delay to the desired delay. But, because of the fast mode in the DMU, the maximum time required to lock can happen when the distance is ≈T/2. For the implemented setup with 37 MHz input clock, and 36.927 MHz sampling clock, this upper boundary is around 4s which will be scaled down proportionally for higher input frequency. The gate count of the entire unit is <6K i.e. NAND3 equivalent gates. Because of the relatively small gate count and very low activity factor, the power estimate of the entire control logic would be quite insignificant when the system is implemented using an ASIC design.

The advantages of the system are that the closed loop control for a delay generation system allows much better accuracy than the open loop case to generate arbitrary fractional unit interval delays. The elements constituting the system need to be carefully designed to enable stability and precision of delay generated across full range. Asynchronous sub-sampling followed by statistical averaging allows accurate and precise measurement of static skews between periodic signals. The system of the present disclosure periodically measures, corrects the error to keep it at the minimum and does not require any special calibration mode for error correction. Therefore, the system can run without interruption for a long time with minimum error even if the slow varying parameters like temperature vary with time. Up to 40× improvement in accuracy are measured by enabling the feedback control. Some of the numbers for example, frequency of operation and jitter at the output are better if all the components are built on-chip. Since the loop control is slow, the input jitter directly propagates to output.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

In addition, where features or aspects of the disclosure are described in terms of Markush groups, those skilled in the art will recognize that the disclosure is also thereby described in terms of any individual member or subgroup of members of the Markush group.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. A system to generate a predetermined fractional period delay in an integrated circuit comprising:
   a controllable delay line block with a predefined number of taps to generate a predetermined delayed output for an input clock, wherein said predefined number of taps of the said delay line block are adjusted to a value determined by a closed loop controller action;
   a sampling block to sample the input clock and the delayed output to generate sub-sampled signals corresponding to the input and delayed output signals;
   a delay measurement unit (DMU) to process the sub-sampled signals to generate required parameters for closing the loop; and
   a delay control unit to receive the required parameters from the DMU and predefined user input data to estimate delay between the input and the output, generate tap values, and adjust the taps of the controllable delay line using said tap values to generate the predetermined time delay.

2. The system as claimed in claim 1, wherein the input clock signal is a periodic signal and the property of both the input and the delayed output being periodic in nature is utilized to reduce the hardware of the delay measurement system compared to conventional systems.

3. The system as claimed in claim 1, wherein the predetermined parameters generated by the DMU are a measured delay count proportional to the actual delay and a period count value proportional to the period of the input clock signal.

4. The system as claimed in claim 1, wherein the sub-sampled signals generated by the sampling blocks are low frequency signals compared to the input clock signal and output clock signal of the delay controllable unit.

5. The system as claimed in claim 1, wherein the DMU comprises a time-precision trade-off which is utilized to reduce the total locking time and generate the predetermined time delay.

6. The system as claimed in claim 1, wherein the DMU is operated in a low precision mode when the error is high for a duration until the error changes sign, thereafter, the DMU shifts to high a precision mode as long as the output time delay is close to the target delay by a threshold value.

7. The system as claimed in claim 1, wherein the predefined input data is a target ratio provided by a user to the delay controller.

8. The system as claimed in claim 1, wherein the sampling block performs sampling using an asynchronous sampling clock.

9. The system as claimed in claim 1, wherein the DMU processes the output signals of the sampling block to estimate the skew between the input clock and the output clock signals and generate a measured delay count.

10. The system as claimed in claim 1, wherein the delay control unit samples the measured delay count to obtain an estimate of the value of the present delay, and compares with the value of target delay for controlling the taps of the controllable delay line.

11. The system as claimed in claim 1, wherein the DMU performs averaging over multiple beat cycles to improve accuracy compared with conventional techniques.

* * * * *